(12) United States Patent
Wu et al.

(10) Patent No.: US 8,650,523 B2
(45) Date of Patent: Feb. 11, 2014

(54) SUB-CIRCUIT MODELS WITH CORNER INSTANCES FOR VLSI DESIGNS

(75) Inventors: Zhi-Yuan Wu, Union City, CA (US); Jia Feng, San Jose, CA (US); Juhi Bansal, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/471,736

(22) Filed: May 15, 2012

(65) Prior Publication Data

US 2013/0311963 A1    Nov. 21, 2013

(51) Int. Cl.
*G06F 17/50*      (2006.01)

(52) U.S. Cl.
USPC .......................................... 716/112; 716/111

(58) Field of Classification Search
USPC ............... 716/106, 111, 112, 115; 703/14
See application file for complete search history.

(56) References Cited

U.S. PATENT DOCUMENTS

2008/0109204 A1*  5/2008  Zhang et al. .................... 703/14

* cited by examiner

*Primary Examiner* — Vuthe Siek
(74) *Attorney, Agent, or Firm* — Ditthavong Mori & Steiner, P.C.

(57) ABSTRACT

An approach for providing sub-circuit models with corner instances for VLSI designs is disclosed. Embodiments include: determining a circuit design that includes a plurality of sub-circuit models having a plurality of characteristics; and associating, by a processor, a sub-circuit model of the plurality of sub-circuit models with a corner instance value, and another sub-circuit model of the plurality of sub-circuit models with another corner instance value. Other embodiments include analyzing, by the processor, the circuit design according to the corner instance value and the other corner instance value.

17 Claims, 4 Drawing Sheets

SUB-CIRCUIT MODELS WITH CORNER INSTANCES FOR VLSI DESIGNS

TECHNICAL FIELD

The present disclosure relates to circuit design. The present disclosure is particularly applicable to analysis of very-large-scale integration (VLSI) circuit designs using corners in advanced Complementary Metal Oxide Semiconductor (CMOS) technologies.

BACKGROUND

Fixed corners of Simulation Program with Integrated Circuit Emphasis (SPICE) models are widely used in semiconductor chip design (e.g., VLSI circuit designs) for best and worst case performance estimation. Fixed corner parameters, however, are typically related to either digital or analog performance since it is difficult to capture both analog and digital variations in the same corner with current model equations. As such, designers are forced to separately validate their circuits with a digital corner for digital block designs and an analog corner for analog block designs. That is, traditional fixed corner configurations will not allow designers to analyze a circuit using different corners for digital and analog blocks of the circuit at the same time. Consequently, designers are burdened with higher costs with respect to time and resources since they must separately analyze the circuit using different corners and then verify the results of each analysis.

A need therefore exists for sub-circuit models with corner instances.

SUMMARY

An aspect of the present disclosure is a method for providing sub-circuit models with corner instances.

Another aspect of the present disclosure is an apparatus for providing sub-circuit models with corner instances.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a circuit design that includes a plurality of sub-circuit models having a plurality of characteristics; and associating, by a processor, a sub-circuit model of the plurality of sub-circuit models with a corner instance value, and another sub-circuit model of the plurality of sub-circuit models with another corner instance value.

Aspects of the present disclosure include analyzing, by the processor, the circuit design according to the corner instance value and the other corner instance value. Another aspect includes associating the sub-circuit model with the corner instance value based on a characteristic of the sub-circuit model, and the other sub-circuit model with the other corner instance value based on another characteristic of the other sub-circuit model. Additional aspects include analyzing the circuit design by processing the sub-circuit model using the corner instance value and processing the other sub-circuit model using the other corner instance value. Further aspects include processing a user selection of the corner instance value for the sub-circuit model, and the other corner instance value for the other sub-circuit model, wherein the association is based on the user selection. Moreover, some aspects include the corner instance value and the other corner instance value being selected from a process corner library associated with the circuit design.

Certain aspects include the corner instance value being associated with a digital corner, the sub-circuit model being a digital sub-circuit model, the other corner instance value being associated with an analog corner, and the other sub-circuit model being an analog sub-circuit model. Various aspects include calibrating the digital corner with digital parameters, and the analog corner with analog parameters. Some aspects include assigning the sub-circuit model with a unique index value of a corner instance associated with the corner instance value, and the other sub-circuit model with another unique index value of another corner instance associated with the other corner instance value. Other aspects include calculating tolerance for the sub-circuit model based on the unique index value, and for the other sub-circuit model based on the other unique index value.

An additional aspect of the present disclosure is an apparatus including a processor, and a memory including computer program code for one or more computer programs, the memory and the computer program code configured to, with the processor, cause the apparatus to: determine a circuit design that includes a plurality of sub-circuit models having a plurality of characteristics; and associate a sub-circuit model of the plurality of sub-circuit models with a corner instance value, and another sub-circuit model of the plurality of sub-circuit models with another corner instance value.

Aspects include the apparatus being further caused to analyze the circuit design according to the corner instance value and the other corner instance value. Another aspect includes the apparatus being further caused to associate the sub-circuit model with the corner instance value based on a characteristic of the sub-circuit model, and the other sub-circuit model with the other corner instance value based on another characteristic of the other sub-circuit model. Certain aspects include the apparatus being further caused to analyze the circuit design by processing the sub-circuit model using the corner instance value and processing the other sub-circuit model using the other corner instance value. Various aspects include the apparatus being further caused to process a user selection of the corner instance value for the sub-circuit model, and the other corner instance value for the other sub-circuit model, wherein the association is based on the user selection. Other aspects include the corner instance value and the other corner instance value being selected from a process corner library associated with the circuit design.

Further aspects include the corner instance value being associated with a digital corner, the sub-circuit model being a digital sub-circuit model, the other corner instance value being associated with an analog corner, and the other sub-circuit model being an analog sub-circuit model. Some aspects include the apparatus being further caused to calibrate the digital corner with digital parameters, and the analog corner with analog parameters.

Another aspect of the present disclosure includes a computer-implemented method comprising: determining a circuit design that includes a plurality of sub-circuit models having a plurality of characteristics; associating a sub-circuit model of the plurality of sub-circuit models with a corner instance value based on a characteristic of the sub-circuit model, and another sub-circuit model of the plurality of sub-circuit models with another corner instance value based on another characteristic of the other sub-circuit model; and analyzing, by a processor, the circuit design according to the corner instance value and the other corner instance value.

Additional aspects include analyzing the circuit design by processing the sub-circuit model using the corner instance value and processing the other sub-circuit model using the other corner instance value. Some aspects include processing a user selection of the corner instance value for the sub-circuit model, and the other corner instance value for the other sub-circuit model, wherein the association is based on the user selection, and the corner instance value and the other corner instance value are selected from a process corner library associated with the circuit design.

Certain aspects include the corner instance value being associated with a digital corner, the sub-circuit model being a digital sub-circuit model, the other corner instance value being associated with an analog corner, and the other sub-circuit model being an analog sub-circuit model. Other aspects include: calibrating the digital corner with digital parameters, and the analog corner with analog parameters.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of inflexibility associated with traditional fixed corner configurations. The present disclosure addresses and solves such problems, for instance, by, inter alia, associating a sub-circuit model of a plurality of sub-circuit models in a circuit design with a corner instance value, and another sub-circuit model of the plurality of sub-circuit models with another corner instance value.

Figure 1:
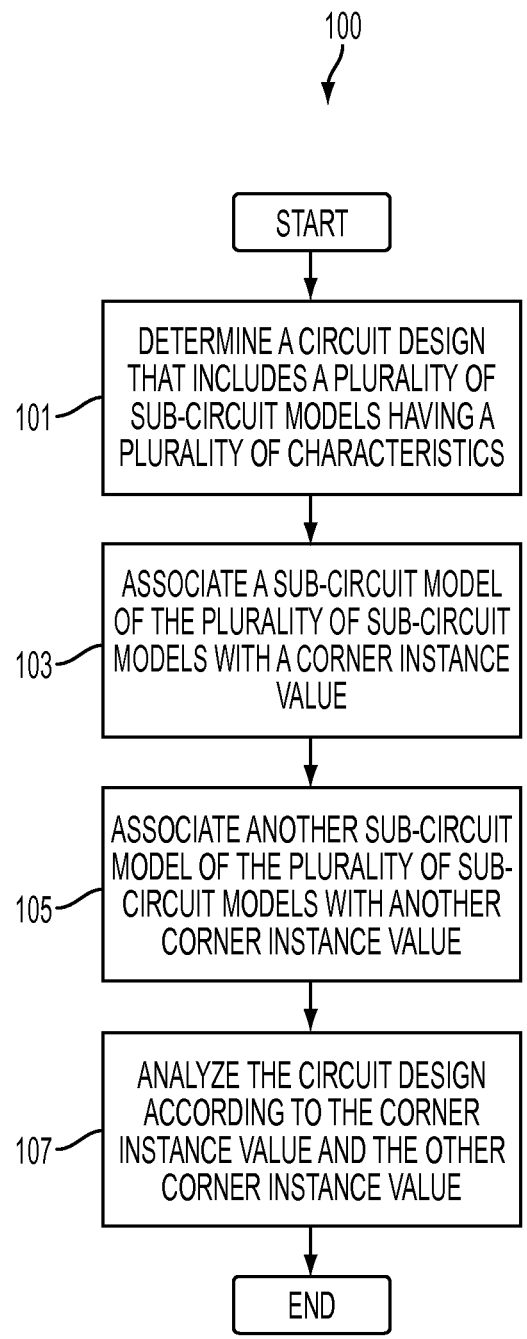
FIG. 1 is a flowchart of a process for providing sub-circuit models with corner instances, in accordance with an exemplary embodiment of the present disclosure.
Figure 4:
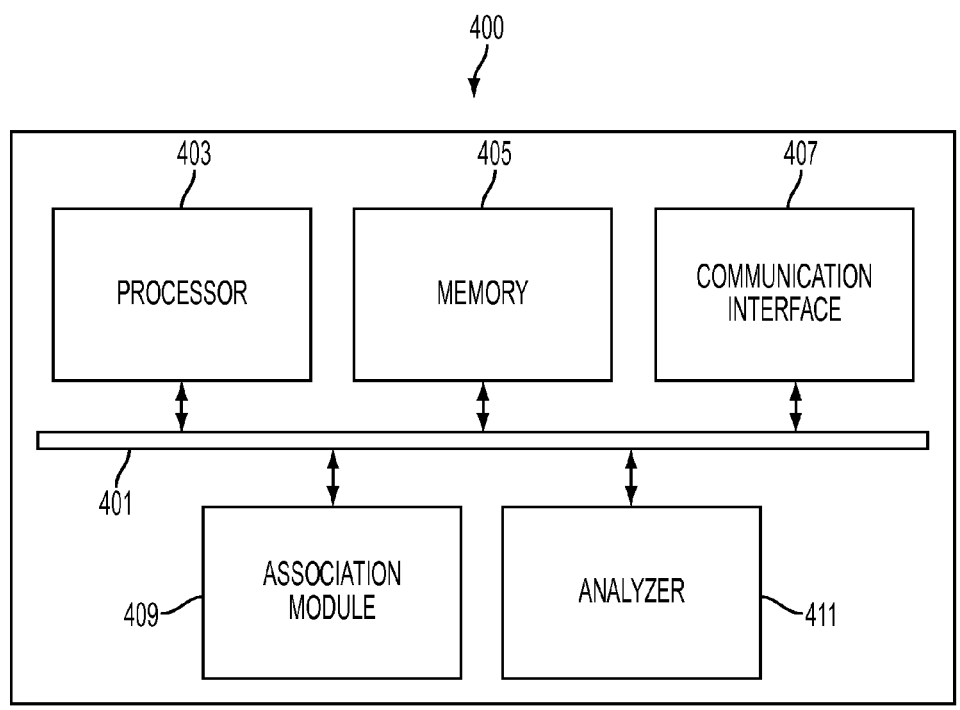
FIG. 4 schematically illustrates a computer system upon which an exemplary embodiment of the invention may be implemented.

FIG. 1 is a flowchart of a process for providing sub-circuit models with corner instances, in accordance with an exemplary embodiment of the present disclosure. A circuit design platform may perform the process 100 and may be implemented in, for instance, a computer system including a processor and a memory as shown in FIG. 4. In step 101, the circuit design platform may determine a circuit design that includes a plurality of sub-circuit models having a plurality of characteristics. As shown, in steps 103 and 105, the circuit design platform may then associate a sub-circuit model of the plurality of sub-circuit models with a corner instance value, and another sub-circuit model of the plurality of sub-circuit models with another corner instance value. By way of example, the sub-circuit model may be associated with the corner instance value based on a characteristic of the sub-circuit model, and the other sub-circuit model may be associated with the other corner instance value based on another characteristic of the other sub-circuit model.

In step 107, the circuit design platform may thereafter analyze the circuit design according to the corner instance value and the other corner instance value. For example, the sub-circuit model may be analyzed using the corner instance value, and the other sub-circuit model may be analyzed using the other corner instance value. In this way, sub-circuit models within the same circuit design may be set to desired corner values (or desired corners) depending on their respective functionalities/characteristics (e.g., digital characteristics, analog characteristics, functional blocks that the sub-circuit models are included within, etc.). Manufacturers, for instance, offer many types of devices with different optimizations based on respective usages of the devices, and, thus, SPICE libraries typically contain sub-circuit models for each device type. As such, having different corner instances and/or corner instance values for different varieties of sub-circuit models enables more accurate and more reliable analysis of a circuit design having the various sub-circuit models.

Figure 2:
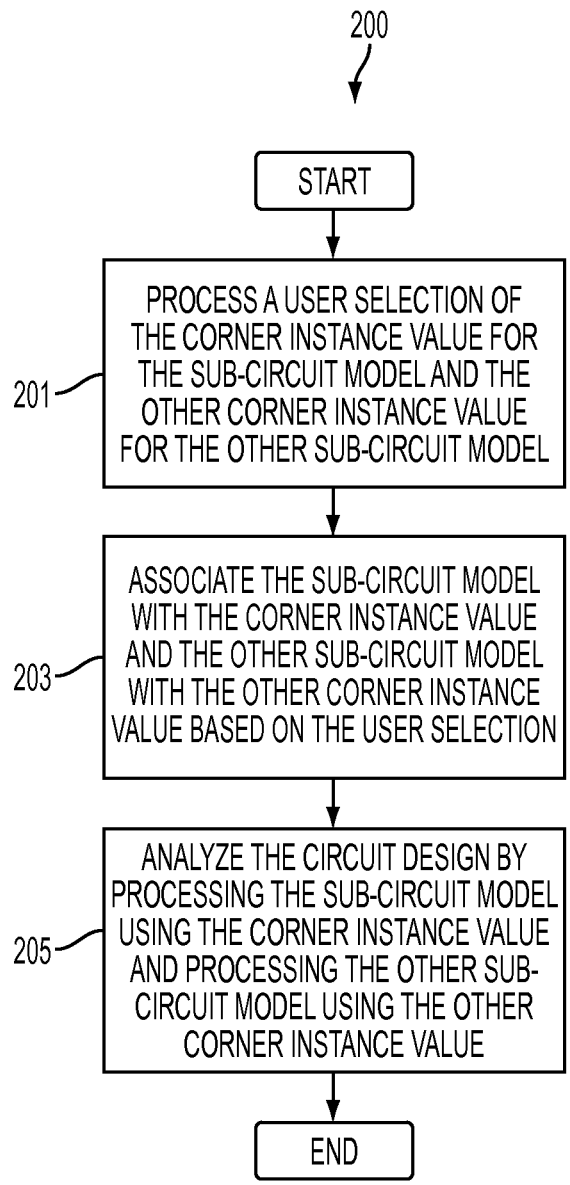
FIG. 2 is flowchart of a process for analyzing circuit designs based on a user selection of different corner instance values for various sub-circuit models, in accordance with an exemplary embodiment of the present disclosure.

FIG. 2 is flowchart of a process for analyzing circuit designs based on a user selection of different corner instance values for various sub-circuit models, in accordance with an exemplary embodiment of the present disclosure. A circuit design platform may perform the process 200 and may be implemented in, for instance, a computer system including a processor and a memory as shown in FIG. 4. In step 201, the circuit design platform may process a user selection of the corner instance value for the sub-circuit model (e.g., based on the characteristic of the sub-circuit model), and the other corner instance value for the other sub-circuit model (e.g., based on the other characteristic of the other sub-circuit model).

By way of example, the corner instance value and the other corner instance value may be selected from a process corner library associated with the corner design. The corner library may, for instance, include configurations that allow users to set sub-circuit models in the same circuit to desired corner values based on their respective functionalities/characteristics (e.g., fixed corner instance values may be applied as local settings for each sub-circuit model as opposed to being applied as a global setting for the entire circuit). The corner instance value may be associated with a digital corner, the sub-circuit model may be a digital sub-circuit model, the other corner instance value may be associated with an analog corner, and the other sub-circuit model may be an analog sub-circuit model. The digital corner may, for instance, be calibrated with digital parameters, and the analog corner may be calibrated with analog parameters.

In step 203, the circuit design platform may associate the sub-circuit model with the corner instance value, and the other sub-circuit model with the other corner instance value, based on the user selection. In step 205, the circuit design platform may then analyze the circuit design by processing the sub-circuit model using the corner instance value and processing the other sub-circuit model using the other corner instance value. In this way, designers are provided with the freedom to utilize corner instance values of their choice for each sub-circuit model within the same circuit design. Thus, in scenarios where the circuit design involves mixed signal circuits (e.g., the design may include a plurality of circuit blocks, many of which may contain a plurality of sub-circuit models have a plurality of characteristics), multiple validations using a single fixed corner instance relating to one type of signal may be avoided. As such, time and other resources associated with circuit design analysis may be reduced (e.g., decrease in the time associated with verifying the results of an analysis).

Figure 3:
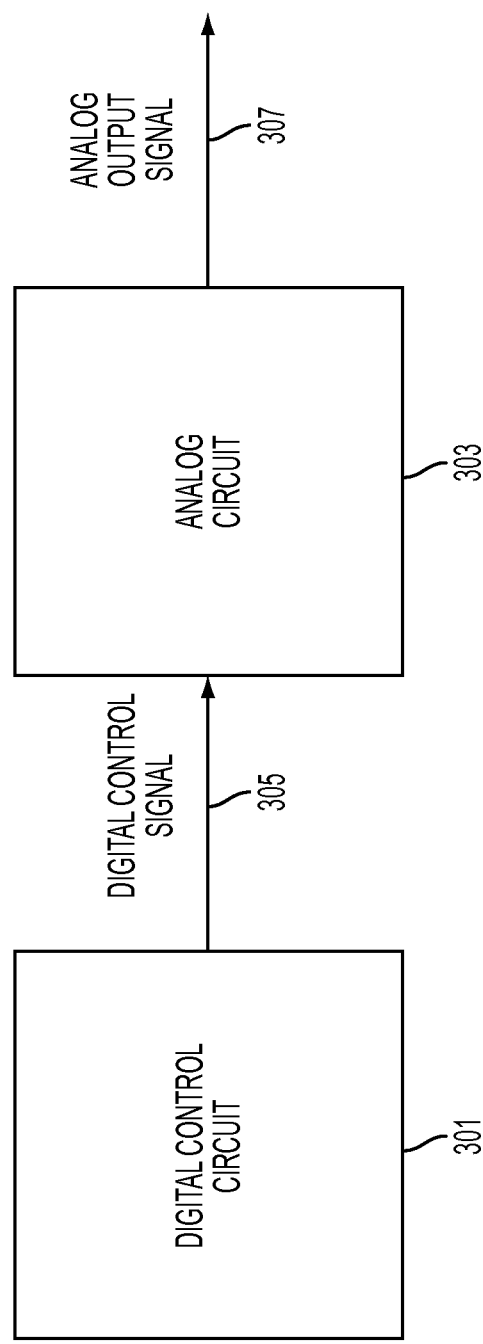
FIG. 3 schematically illustrates an example design having mixed signal circuits, in accordance with an exemplary embodiment of the present disclosure.

FIG. 3 schematically illustrates an example design having mixed signal circuits, in accordance with an exemplary embodiment of the present disclosure. As shown, the circuit design may include a digital control circuit block 301 and an analog circuit block 303. The digital control circuit block 301 and the analog circuit block may, for instance, represent two functional blocks of the circuit design, each of which may contain multiple sub-circuit models to represent various devices within the functional block. As depicted, the digital control circuit block 301 provides a digital control signal 305 to the analog circuit block 303. The analog circuit block 303 then produces an analog output signal 307. With respect to SPICE, a sub-circuit in SPICE simulators defines a basic element which allows a user to reuse the circuit multiple times in designs, similar to a subroutine in software programming. A SPICE sub-circuit definition usually contains a sub-circuit name, nodes of the sub-circuits to be used for connections, and instances which take input values for input variables. These sub-circuits may, for example, be called multiple times with different instance values set by circuit designers. Thus, each sub-circuit may have different characteristics according to node potential and instance values.

For illustrative purposes, Table 1 below provides example settings for a digital device (e.g., MND1) in the digital control circuit block 301 and an analog device (e.g., MNA1) in the analog circuit block 303:

TABLE 1

| MND1 | d1 | g1 | s1 | b1 | nfet | L = 0.03 | W = 0.1 | fc_selector = 1 |
|------|----|----|----|----|------|----------|---------|-----------------|
| ... | | | | | | | | |
| MNA1 | d2 | g2 | s2 | b2 | nfet | L = 0.03 | W = 0.1 | fc_selector = 2 |
| ... | | | | | | | | |

As indicated, in Table 1, there may be many fixed corners in a library set (e.g., SPICE library set). For example, some of them may be calibrated with digital parameters, while others are calibrated with analog parameters. In addition, each fixed corner can be assigned with a unique index value to activate an instance of the fixed corner. In Table 1, MND1 is assigned a calibrated digital corner (from the library set) with a corner index of 1, and MNA1 is assigned a calibrated analog corner (from the library set) with a corner index of 2.

Table 2 below demonstrates example settings for the sub-circuit model "nfet" utilized in Table 1. For example, toler-ance for the sub-circuit may be calculated based on the fixed corner index. The tolerance may then be used to skew the L parameter.

TABLE 2

.subckt    1 2 3 4    nfet    W = 1    L = 1    fc_index = 'fc_index_nfet'
L_tolerance_1 = '(fc_index = 1?): 0.1, 0' ← 0.1 for fc_index = 1,
0 for other fc_index value
L_tolerance_2 = '(fc_index = 2?): 0.07, 0' ← 0.07 for fc_index = 2,
0 for other fc_index value
L_tolerance = 'L_tolerance_1 + L_tolerance_2' ← final tolerance
is determined by fc_index
...
.ends nfet In Table 2, "fc_index" for the sub-circuit model "nfet" is defaulted to a global variable "fc_index_nfet." Similarly, sub-circuit models for other devices, such as "pfet," "anfet," and "apfet," may have their "fc_index" instance set to global variable "fc_index_pfet," "fc_index_anfet," and "fc_index_apfet," respectively. By way of example, assuming digital models use "nfet" and "pfet" only, and analog models use "anfet" and "apfet" only, digital devices which use "nfet" and "pfet" models may easily be skewed to a digital corner (e.g., with a corner index of 1), and analog devices which use "anfet" and "apfet" models may be skewed to an analog corner (e.g., with a corner index of 2) as follows: fc_index_nfet=1; fc_index_pfet=1; fc_index_anfet=2; and fc_index_apfet=2. As such, simulations with circuit designs containing both digital and analog sub-circuit models can be performed with proper corner settings with few global switches. In this way, designers are provided with more flexibility for design experimentation. In addition, designers can check their circuit response to the skew of certain types of devices. Furthermore, designers are provided with flexibility for debugging simulations, and they can verify if process adjustments to a certain type of device will affect their circuit the way that they expect.

FIG. 4 schematically illustrates a computer system 400 upon which an exemplary embodiment of the invention may be implemented. Computer system 400 may, for instance, be programmed (e.g., via computer program code or instructions) to associate sub-circuit models with corner instance values as described herein and may include a communication mechanism such as a bus 401 for passing information between other internal and external components of the computer system 400. Moreover, computer system 400 may include a processor (or multiple processors) 403 for performing a set of operations on information as specified by computer program code related to associating sub-circuit models with corner instance values. Computer system 400 may also include memory 405 coupled to bus 401. The memory 405 may, for instance, include dynamic storage, static storage, or a combination thereof for storing information including processor instructions for associating sub-circuit models with corner instance values.

By way of example, based on computer program code in memory 405, processor 403 may interact with communication interface 407 to receive a circuit design that includes a plurality of sub-circuit models having a plurality of characteristics. Processor 403 may then work with association module 409 to identify that the circuit design has a plurality of sub-circuit models having a plurality of characteristics. As a result, the association module 409 may associate one of the sub-circuit models of the circuit design with a corner instance value (e.g., associated with a digital corner) based on a characteristic of the sub-circuit model (e.g., the sub-circuit model is a digital sub-circuit model), and another one of the sub-circuit models of the circuit design with another corner instance value (e.g., associated with an analog corner) based on another characteristic of the other sub-circuit model (e.g., the other sub-circuit model is an analog sub-circuit model). Thereafter, processor 403 may direct the analyzer 411 to analyze the circuit design according to the corner instance value and the other corner instance value. The analyzer 411 may, for example, analyze the circuit design by processing the sub-circuit model using the corner instance value and processing the other sub-circuit model using the other corner instance value. These sub-circuit models and corner instance values may be developed or selected from a SPICE model library containing various device/sub-circuit models and fixed corners. For example, a circuit designer may design a circuit block by adding or replacing device/sub-circuit models from the SPICE model library.

It is noted that, in various aspects, some or all of the techniques described herein are performed by computer system 400 in response to processor 403 executing one or more sequences of one or more processor instructions contained in memory 405. Such instructions, also called computer instructions, software and program code, may be read into memory 405 from another computer-readable medium such as a storage device or a network link. Execution of the sequences of instructions contained in memory 405 causes processor 403 to perform one or more of the method steps described herein. In alternative embodiments, hardware, such as application-specific integrated circuits (ASICs), may be used in place of or in combination with software to implement the invention. Thus, embodiments of the invention are not limited to any specific combination of hardware and software, unless otherwise explicitly stated herein.

The embodiments of the present disclosure can achieve several technical effects, including reduced time and resources spent on analyzing and verifying circuit designs. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    determining a circuit design that includes a plurality of sub-circuit models having a plurality of characteristics;
    associating, by a processor, a sub-circuit model of the plurality of sub-circuit models with a corner instance value, and another sub-circuit model of the plurality of sub-circuit models with another corner instance value; and
    assigning the sub-circuit model with a unique index value of a corner instance associated with the corner instance value, and the other sub-circuit model with another unique index value of another corner instance associated with the other corner instance value, wherein the corner instance value is associated with a digital corner, the sub-circuit model is a digital sub-circuit model, the other corner instance value is associated with an analog corner, and the other sub-circuit model is an analog sub-circuit model.

2. The method according to claim 1, further comprising:
    analyzing, by the processor, the circuit design according to the corner instance value and the other corner instance value.

3. The method according to claim 1, further comprising:
    associating the sub-circuit model with the corner instance value based on a characteristic of the sub-circuit model, and the other sub-circuit model with the other corner instance value based on another characteristic of the other sub-circuit model.

4. The method according to claim 1, further comprising:
    processing a user selection of the corner instance value for the sub-circuit model, and the other corner instance value for the other sub-circuit model, wherein the association is based on the user selection.

5. The method according to claim 4, wherein the corner instance value and the other corner instance value are selected from a process corner library associated with the circuit design.

6. The method according to claim 1, further comprising:
    calibrating the digital corner with digital parameters, and the analog corner with analog parameters.

7. The method according to claim 1, further comprising:
    calculating tolerance for the sub-circuit model based on the unique index value, and for the other sub-circuit model based on the other unique index value.

8. An apparatus comprising:
    a processor; and
    a memory including computer program code for one or more programs,
    the memory and the computer program code configured to, with the processor, cause the apparatus to perform at least the following:
    determine a circuit design that includes a plurality of sub-circuit models having a plurality of characteristics;
    associate a sub-circuit model of the plurality of sub-circuit models with a corner instance value, and another sub-circuit model of the plurality of sub-circuit models with another corner instance value; and
    assign the sub-circuit model with a unique index value of a corner instance associated with the corner instance value, and the other sub-circuit model with another unique index value of another corner instance associated with the other corner instance value, wherein the corner instance value is associated with a digital corner, the sub-circuit model is a digital sub-circuit model, the other corner instance value is associated with an analog corner, and the other sub-circuit model is an analog sub-circuit model.

9. The apparatus according to claim 8, wherein the apparatus is further caused to:
    analyze the circuit design according to the corner instance value and the other corner instance value.

10. The apparatus according to claim 8, wherein the apparatus is further caused to:
    associate the sub-circuit model with the corner instance value based on a characteristic of the sub-circuit model, and the other sub-circuit model with the other corner instance value based on another characteristic of the other sub-circuit model.

11. The apparatus according to claim 8, wherein the apparatus is further caused to:
  process a user selection of the corner instance value for the sub-circuit model, and the other corner instance value for the other sub-circuit model, wherein the association is based on the user selection.

12. The apparatus according to claim 11, wherein the corner instance value and the other corner instance value are selected from a process corner library associated with the circuit design.

13. The apparatus according to claim 8, wherein the apparatus is further caused to:
  calibrate the digital corner with digital parameters, and the analog corner with analog parameters.

14. A computer-implemented method comprising:
  determining a circuit design that includes a plurality of sub-circuit models having a plurality of characteristics;
  associating a sub-circuit model of the plurality of sub-circuit models with a corner instance value based on a characteristic of the sub-circuit model, and another sub-circuit model of the plurality of sub-circuit models with another corner instance value based on another characteristic of the other sub-circuit model;
  analyzing, by a processor, the circuit design according to the corner instance value and the other corner instance value; and
  assigning the sub-circuit model with a unique index value of a corner instance associated with the corner instance value, and the other sub-circuit model with another unique index value of another corner instance associated with the other corner instance value, wherein the corner instance value is associated with a digital corner, the sub-circuit model is a digital sub-circuit model, the other corner instance value is associated with an analog corner, and the other sub-circuit model is an analog sub-circuit model.

15. The computer-implemented method according to claim 14, further comprising:
  analyzing the circuit design by processing the sub-circuit model using the corner instance value and processing the other sub-circuit model using the other corner instance value.

16. The computer-implemented method according to claim 14, further comprising:
  processing a user selection of the corner instance value for the sub-circuit model, and the other corner instance value for the other sub-circuit model, wherein the association is based on the user selection, and the corner instance value and the other corner instance value are selected from a process corner library associated with the circuit design.

17. The computer-implemented method according to claim 14, further comprising calibrating the digital corner with digital parameters, and the analog corner with analog parameters.

* * * * *